(12) United States Patent
Zeng et al.

(10) Patent No.: US 7,214,601 B2
(45) Date of Patent: May 8, 2007

(54) MANUFACTURING PROCESS AND STRUCTURE OF POWER JUNCTION FIELD EFFECT TRANSISTOR

(75) Inventors: Jun Zeng, Taipei Hsien (TW); Po-I Sun, Taipei Hsien (TW)

(73) Assignee: Pyramis Corporation, Taipei (TW)

( * ) Notice: Subject to any disclaimer, the term of this patent is extended or adjusted under 35 U.S.C. 154(b) by 0 days.

(21) Appl. No.: 11/194,354

(22) Filed: Aug. 1, 2005

(65) Prior Publication Data

US 2006/0255374 A1 Nov. 16, 2006

(30) Foreign Application Priority Data

May 13, 2005 (TW) .............................. 94115660 A

(51) Int. Cl.
*H01L 21/20* (2006.01)
(52) U.S. Cl. ...................... 438/486; 257/E21; 257/421

(58) Field of Classification Search ................. 257/256
See application file for complete search history.

(56) References Cited

U.S. PATENT DOCUMENTS 6,326,317 B1 * 12/2001 Wang et al. ................. 438/779

* cited by examiner

*Primary Examiner*—W. David Coleman
*Assistant Examiner*—Ankush Singal

(57) ABSTRACT

A manufacturing process and a power junction field-effect transistor (JFET) are provided. The basic concept of the present invention is to allow the current to flow vertically from the drain region on the bottom side to the source region on the topside of the device. By regulating the voltage applied between the gate regions and the source region, the power junction field-effect transistor (JFET) of the present invention can be built to handle large current and higher voltage for power management purposes, as is similar to the metal oxide semiconductor field effect transistor (MOSFET).

12 Claims, 3 Drawing Sheets

MANUFACTURING PROCESS AND STRUCTURE OF POWER JUNCTION FIELD EFFECT TRANSISTOR

FIELD OF THE INVENTION

The present invention relates to a manufacturing process and a structure of a power field-effect transistor, and more particularly to a manufacturing process and a structure of a power junction field-effect transistor.

BACKGROUND OF THE INVENTION

Recently, field effect transistors (FETs) such as metal oxide semiconductor field effect transistors (MOSFETs) or junction field effect transistors (JFETs) have achieved a great deal of advance in their performance and manufacturing process technology. The field-effect transistor is a transistor that relies on an electric field to control the shape of the nonconductive depletion layer within a semiconductor material, thus controlling the conductivity of a channel in that material. In other words, once a voltage is applied between the gate region and the source layer, the current is controlled to flow vertically from the drain region to the source layer with the gate region in between. Like all transistors, field-effect transistors can be used as voltage-controlled variable resistors or voltage controlled current sources.

The junction field-effect transistor (JFET) uses voltage applied across a reverse-biased PN junction between the gate region and the source/drain region to control the width of the depletion region, which then controls the conductivity of a semiconductor channel. The metal oxide semiconductor field effect transistor (MOSFET) is a field-effect transistor having a metallic gate insulated from the channel by an oxide layer and the channel conductivity thereof is dependent only on the potential at the gate region.

The MOSFET device is extensively used in digital circuits because the structure thereof is developed toward minimization and it is a very efficient switch. As such, it is possible to fabricate a great number of MOS transistors in a single chip. The structure of the junction field-effect transistor (JFET) is distinguished from the metal oxide semiconductor field effect transistor (MOSFET). Due to the structure difference, the junction field-effect transistors (JFETs) are typically used as analog switches or signal amplifiers, especially low-noise amplifiers, but seldom used as logical operation units or power amplifiers.

Due to the specific structure, the conventional junction field-effect transistor (JFET) fails to handle large current for power management purposes. It is important to modify and regulate the structure and the manufacturing process of the junction field-effect transistor (JFET) so as to overcome the above-described disadvantages resulted from the prior art.

SUMMARY OF THE INVENTION

The basic concept of the present invention is to allow the current to flow vertically from the drain region on the bottom side to the source region on the topside of the device. By regulating the voltage applied between the gate regions and the source region, the power junction field-effect transistor (JFET) of the present invention can be built to handle large current and higher voltage for power management purposes, as is similar to the metal oxide semiconductor field effect transistor (MOSFET).

In accordance with a first aspect of the present invention, there is provided a process for manufacturing a power junction field-effect transistor (JFET). The process comprising steps of (a) providing a substrate having an epitaxy layer formed thereon; (b) forming an oxide layer on the epitaxy layer; (c) patterning the oxide layer by a first photolithography and etching procedure to define a gate runner window and a guard ring window; (d) performing a first implanting procedure to implant a first dopant in the epitaxy layer through the gate runner window and the guard ring window; (e) patterning the oxide layer by a second photolithography and etching procedure to define a pair of gate windows; (f) performing a second implanting procedure to implant a second dopant in the epitaxy layer through the gate runner window and the gate windows, thereby forming a pair of gate regions and a gate runner in the epitaxy layer; (g) forming an inter-layer dielectrics layer on the oxide layer; (h) patterning the inter-layer dielectrics layer and the oxide layer by a third photolithography and etching procedure to define a source window; (i) performing a third implanting procedure to implant a third dopant through the source window, thereby forming a source layer overlying the gate regions; (j) patterning the inter-layer dielectrics layer and the oxide layer overlying the gate runner by a fourth photolithography and etching procedure to define a gate runner/metal layer junction window; and (k) depositing a metal layer on the resulting structure, and patterning the metal layer by a fifth photolithography and etching procedure to form a gate runner metal layer and a source metal layer, which are connected to the gate runner and the source layer, respectively.

In an embodiment, the substrate is an N+ silicon substrate, and the epitaxy layer is an N epitaxy layer.

In an embodiment, the oxide layer is a field oxide layer.

In an embodiment, the first dopant is a P+ type of dopant.

In an embodiment, the process further comprises a step of performing an annealing procedure after the step (d).

In an embodiment, the second dopant is a P+ type of dopant.

In an embodiment, the process further comprises a step of performing an annealing procedure after the step (f).

In an embodiment, the third dopant is an N+ type of dopant.

In an embodiment, the inter-layer dielectrics layer is a deposition oxide layer.

In an embodiment, the area underlying the gate regions is defined as a drain region.

In an embodiment, the process further comprises steps of (l) depositing a passivation layer on the gate runner metal layer and the source metal layer; and (m) patterning the passivation layer by a sixth photolithography and etching procedure to define first and second pad areas for the gate runner metal layer and the source metal layer, respectively.

Preferably, the passivation layer is made of silicon oxide or nitride oxide.

In accordance with a second aspect of the present invention, there is provided a structure of a power junction field-effect transistor (JFET). The structure of the power junction field-effect transistor (JFET) comprises a substrate; an epitaxy layer formed on the substrate; a pair of gate regions comprising two gate units parallel with each other and formed in the epitaxy layer; a gate runner formed in the epitaxy layer and electrically connected to the gate regions; a source layer formed on the epitaxy layer and overlying the gate regions; an oxide layer formed on the epitaxy layer and having a gate runner window and a source window; and a gate runner metal layer and a source metal layer connected to the gate runner and the source layer through the gate runner window and the source window, respectively.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

A process for manufacturing a power junction field-effect transistor (JFET) according to a preferred embodiment of the present invention will be illustrated as follows with reference to FIGS. 1(a)~1(h).

Figure 1A:
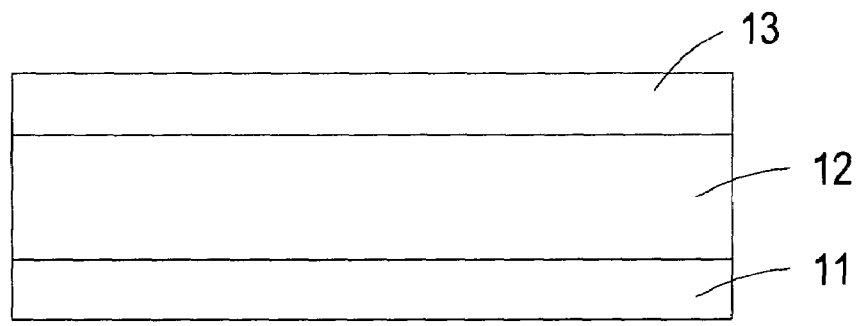
FIGS. 1(a)~1(h) illustrate the steps of a process for manufacturing a power junction field-effect transistor (JFET) according to a preferred embodiment of the present invention.
Figure 1B:
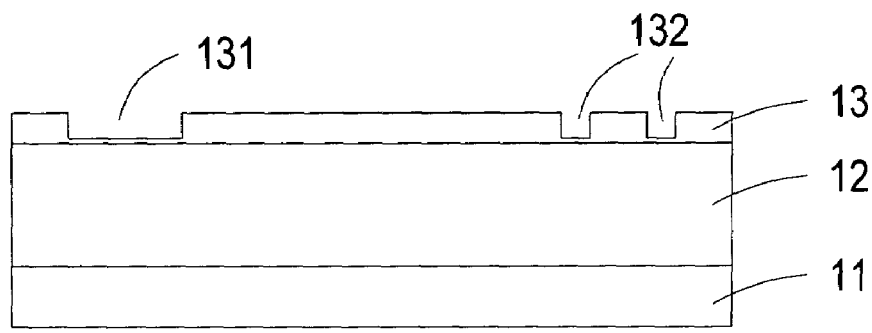
Figure 1C:
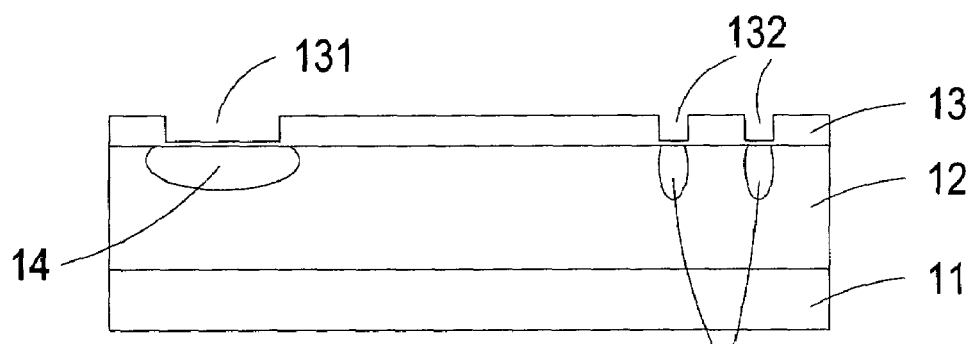

Firstly, a substrate 11 such as an N+ silicon substrate is provided. Then, an epitaxy layer 12 such as an N epitaxy layer is formed on the substrate 11. Then, an oxide layer 13 such as a filed oxide layer is formed on the epitaxy layer 12 according to a thermal oxidation procedure, thereby forming the resulting structure of FIG. 1(a). Then, the oxide layer 13 is patterned by a first photolithography and etching procedure to form a gate runner window 131 and a guard ring window 132, as is shown in FIG. 1(b). As shown in FIG. 1(c), after a first implanting procedure is performed to implant a first dopant in the epitaxy layer 12 through the gate runner window 131 and the guard ring window 132, a gate runner well 14 and a guard ring region 15 are formed in the epitaxy layer 12. In some embodiments, the first dopant is a P+ dopant, and thus the gate runner well 14 and a guard ring region 15 are P+ doped. After the first implanting procedure, an annealing procedure is performed to drive-in the P+ gate runner well 14 and the P+ guard ring region 15.

Figure 1D:
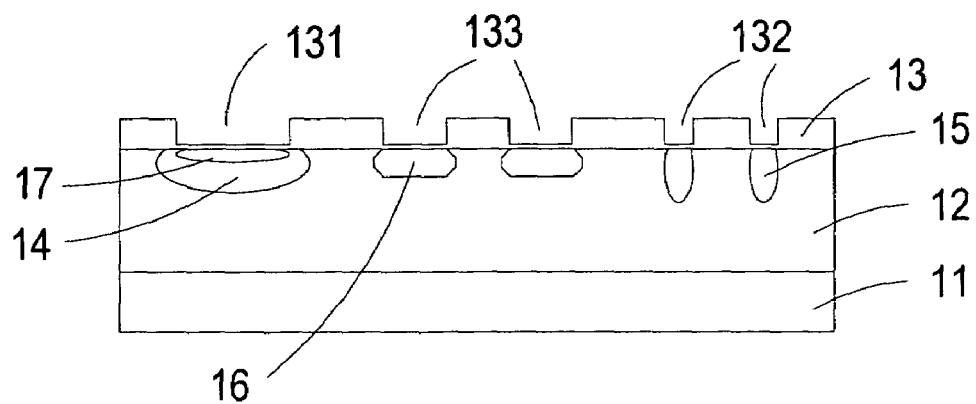
Figure 1E:
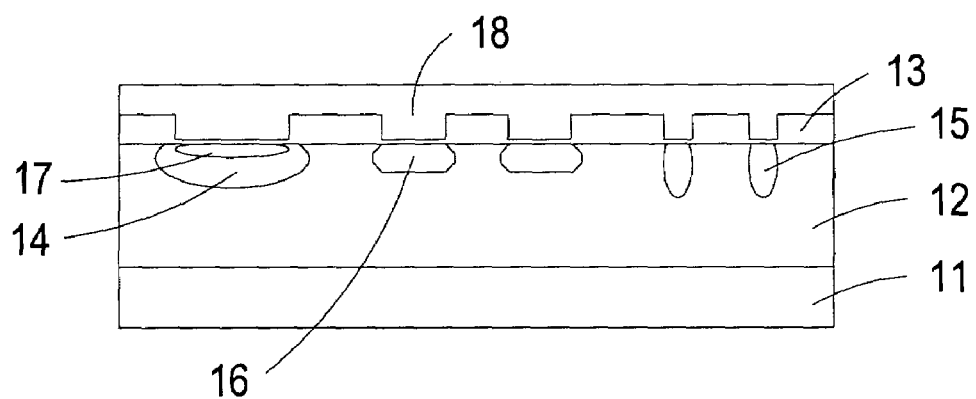

Next, the oxide layer 13 is patterned by a second photolithography and etching procedure to form a pair of gate windows 133. After a second implanting procedure is performed to implant a second dopant in the epitaxy layer 12 through the gate runner window 131 and the gate windows 133, a pair of gate regions 16 and a gate runner 17 are formed in the epitaxy layer 12, as shown in FIG. 1(d). In some embodiments, the second dopant is a P+ dopant, and thus the gate regions 16 and the gate runner 17 are P+ doped. After the second implanting procedure, another annealing procedure is performed to drive-in the P+ gate regions 16 and the gate runner 17. Then, as shown in FIG. 1(e), an ILD (Inter-Layer Dielectrics) layer 18 such as a deposition oxide layer is deposited on the oxide layer 13.

Next, the ILD layer 18 and the oxide layer 13 are patterned by a third photolithography and etching procedure to form a source window 181. After a third implanting procedure is performed to implant a third dopant through the source window 181, a source layer 19 overlying the gate regions 16 is formed. In some embodiments, the third dopant is an N+ dopant, and thus the source layer 19 is N+ doped.

Figure 1F:
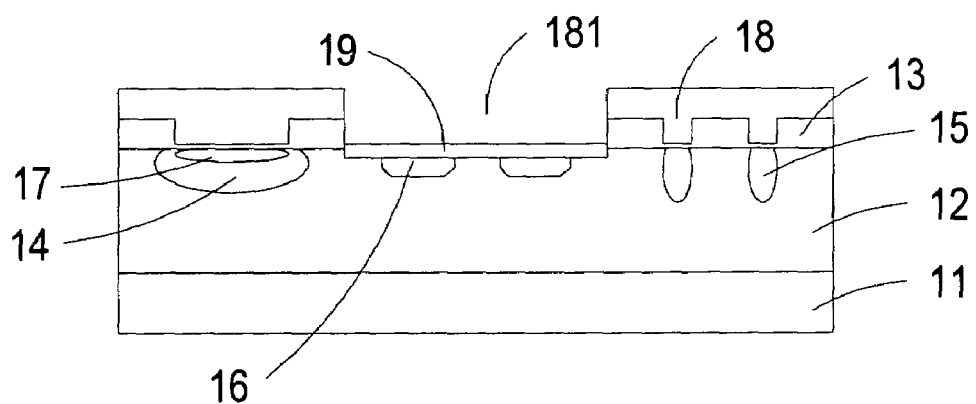

After the third implanting procedure, another annealing procedure is performed to drive-in the N+ source layer 19 to form the resulting structure of FIG. 1(f).

Figure 1G:
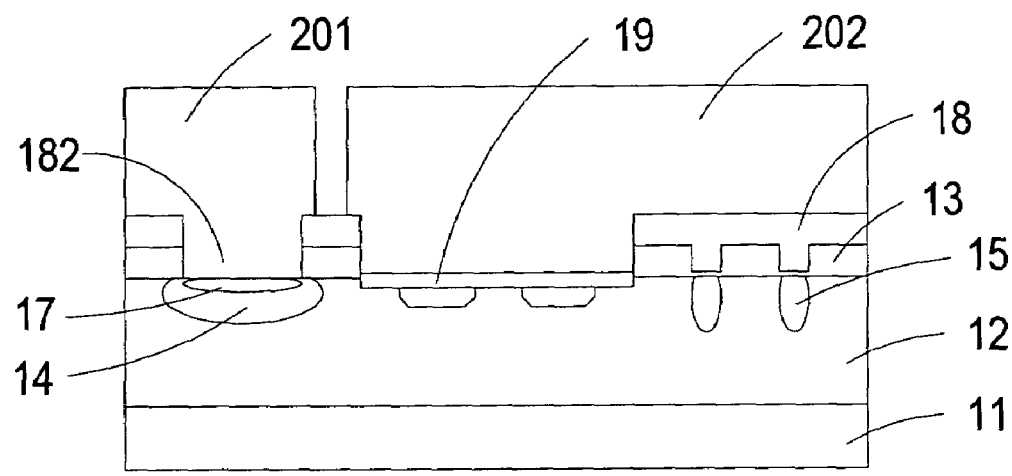
Figure 1H:
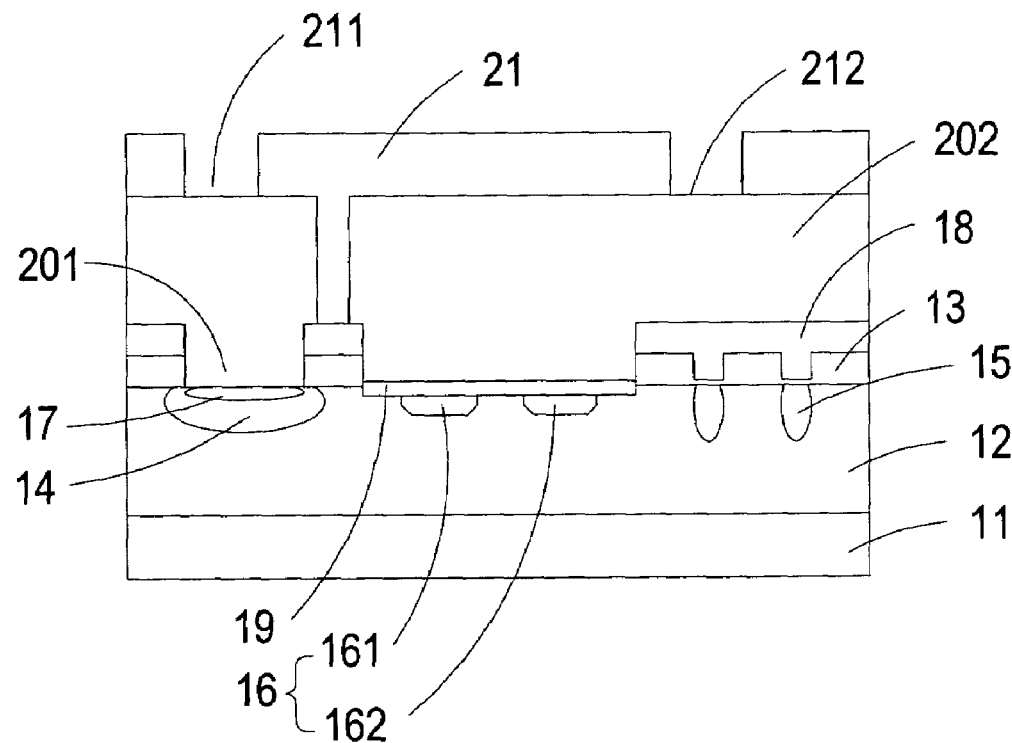

Next, the ILD layer 18 and the oxide layer 13 overlying the gate runner 17 are patterned by a fourth photolithography and etching procedure to form a gate runner/metal layer junction window 182. After a metal layer is deposited on the resulting structure, the metal layer is patterned by a fifth photolithography and etching procedure to form a gate runner metal layer 201 and a source metal layer 202, which are connected to the gate runner 17 and the source layer 19, respectively. The resulting structure is shown in FIG. 1(g). Afterwards, a passivation layer 21 is deposited on the resulting structure of 1(g). The passivation layer 21 is patterned by a sixth photolithography and etching procedure to define a pad area 211 for the gate runner metal layer 201 and another pad area 212 for the source metal layer 202. Meanwhile, the power junction field-effect transistor of the present invention as shown in FIG. 1(h) is produced accordingly.

Please refer again to FIG. 1(h), the structure of the power junction field-effect transistor (JFET) comprises a substrate 11; an epitaxy layer 12 formed on the substrate 11; a filed oxide layer 13 formed on the epitaxy layer 12 and having a gate runner window and a guard ring window; a pair of gate regions 16 comprising two gate units 161 and 162 parallel with each other and formed in the epitaxy layer 12; a gate runner 17 formed in the epitaxy layer 12 and electrically connected to the gate regions 16; a deposition oxide layer 18 formed on the filed oxide layer 13; a source layer 19 formed on the surface of the epitaxy layer 12 and overlying the gate regions 16; and a gate runner metal layer 201 and a source metal layer 202 connected to the gate runner 17 and the source layer 19 through the gate runner window and the guard ring window, respectively.

In some embodiments, the substrate 11 is an N+ silicon substrate, and the epitaxy layer 12 is an N epitaxy layer. In addition, the gate regions 16 and the gate runner 17 are P+ doped. The gate runner well 14 surrounding the gate runner 17 is also P+ doped. Whereas, the source layer 19 is N+ doped.

In the above embodiments, the area underlying the gate regions 16 is defined as a drain region. By regulating the voltage applied between the gate regions 16 and the source layer 19, the current would flow vertically from the drain region on the bottom side to the source layer 19 on the topside of the device through the gate units 161 and 162. Therefore, the power junction field-effect transistor (JFET) of the present invention can be built to handle large current and higher voltage for power management purposes, as is similar to the metal oxide semiconductor field effect transistor (MOSFET).

By the way, the power junction field-effect transistor (JFET) of the present invention further comprises a guard ring region 15 formed in the epitaxy layer 12. The guard ring region 15 is preferably P+ doped. The power junction field-effect transistor (JFET) further comprises a passivation layer 21 formed on the gate runner metal layer 201 and the source metal layer 202. The passivation layer 21 is etched to define a pad area 211 for the gate runner metal layer 201 and another pad area 212 for the source metal layer 202 so as to implement wire bonding operations through the pad areas 211 and 212, respectively. Preferably, the passivation layer 21 is made of silicon oxide or nitride oxide.

It is noted that, however, those skilled in the art will readily observe that numerous modifications and alterations of the structure and the manufacturing process may be made while retaining the teachings of the invention. For example, a great number of identical and paralleled JFET units may be included in a semiconductor chip to handle larger current. Accordingly, the above disclosure should be limited only by the bounds of the following claims.

From the above description, the power junction field-effect transistor (JFET) of the present invention can be built to handle large current and higher voltage for power management purposes by regulating the voltage applied between the gate regions and the source layer. As a consequence, the purpose for implementing power management is similar to the metal oxide semiconductor field effect transistor (MOSFET) by using the power junction field-effect transistor (JFET) of the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for manufacturing a power junction field-effect transistor (JFET), comprising steps of:
    (a) providing a substrate having an epitaxy layer formed thereon;
    (b) forming an oxide layer on said epitaxy layer;
    (c) patterning said oxide layer by a first photolithography and etching procedure to define a gate runner window and a guard ring window;
    (d) performing a first implanting procedure to implant a first dopant in said epitaxy layer through said gate runner window and said guard ring window;
    (e) patterning said oxide layer by a second photolithography and etching procedure to define a pair of gate windows;
    (f) performing a second implanting procedure to implant a second dopant in said epitaxy layer through said gate runner window and said gate windows, thereby forming a pair of gate regions and a gate runner in said epitaxy layer;
    (g) forming an inter-layer dielectrics layer on said oxide layer;
    (h) patterning said inter-layer dielectrics layer and said oxide layer by a third photolithography and etching procedure to define a source window;
    (i) performing a third implanting procedure to implant a third dopant through said source window, thereby forming a source layer overlying said gate regions;
    (j) patterning said inter-layer dielectrics layer and said oxide layer overlying the gate runner by a fourth photolithography and etching procedure to define a gate runner/metal layer junction window; and
    (k) depositing a metal layer on the resulting structure, and patterning said metal layer by a fifth photolithography and etching procedure to form a gate runner metal layer and a source metal layer, which are connected to said gate runner and said source layer, respectively.

2. The process according to claim 1 wherein said substrate is an N+ silicon substrate, and said epitaxy layer is an N epitaxy layer.

3. The process according to claim 1 wherein said oxide layer is a field oxide layer.

4. The process according to claim 1 wherein said first dopant is a P+ type of dopant.

5. The process according to claim 1 further comprising a step of performing an annealing procedure after said step (d).

6. The process according to claim 1 wherein said second dopant is a P+ type of dopant.

7. The process according to claim 1 further comprising a step of performing an annealing procedure after said step (f).

8. The process according to claim 1 wherein said third dopant is an N+ type of dopant.

9. The process according to claim 1 wherein said inter-layer dielectrics layer is a deposition oxide layer.

10. The process according to claim 1 wherein the area underlying said gate regions is defined as a drain region.

11. The process according to claim 1 further comprising steps of:
    (l) depositing a passivation layer on said gate runner metal layer and said source metal layer; and
    (m) patterning said passivation layer by a sixth photolithography and etching procedure to define first and second pad areas for said gate runner metal layer and said source metal layer, respectively.

12. The process according to claim 11 wherein said passivation layer is made of silicon oxide or nitride oxide.

* * * * *